US007669095B2

(12) United States Patent  (10) Patent No.: US 7,669,095 B2
Clark et al.  (45) Date of Patent: Feb. 23, 2010

(54) METHODS AND APPARATUS FOR ERROR INJECTION

(75) Inventors: Scott D. Clark, Rochester, MN (US); Jeffrey Joseph Ruedinger, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 394 days.

(21) Appl. No.: 11/344,907

(22) Filed: Feb. 1, 2006

(65) Prior Publication Data

US 2007/0208977 A1    Sep. 6, 2007

(51) Int. Cl.
*G01R 31/28*   (2006.01)
*G06F 11/00*   (2006.01)
(52) U.S. Cl. .......................................... 714/724; 714/41
(58) Field of Classification Search ...................... 714/2, 714/41, 724, 738, 739, 728, 54
See application file for complete search history.

(56) References Cited

U.S. PATENT DOCUMENTS

| 5,001,712 | A  | * | 3/1991  | Splett et al. ................. 714/703 |
| 5,072,447 | A  |   | 12/1991 | Perloff et al. |
| 5,872,910 | A  | * | 2/1999  | Kuslak et al. ................. 714/41 |
| 6,233,073 | B1 |   | 5/2001  | Bowers et al. |
| 6,457,147 | B1 | * | 9/2002  | Williams ..................... 714/703 |
| 6,751,756 | B1 | * | 6/2004  | Hartnett et al. ............... 714/54 |
| 6,799,287 | B1 | * | 9/2004  | Sharma et al. ............. 714/703 |
| 6,971,048 | B1 | * | 11/2005 | Hanson et al. ................ 714/41 |
| 7,020,803 | B2 | * | 3/2006  | Wolin et al. .................. 714/41 |
| 2004/0034820 | A1 | * | 2/2004 | Soltis et al. .................... 714/47 |

* cited by examiner

*Primary Examiner*—Phung M Chung
(74) *Attorney, Agent, or Firm*—Dugan & Dugan, PC

(57) ABSTRACT

In a first aspect, a first method of injecting one or more errors in data flowing into or out of a chip is provided. The first method includes the steps of (1) generating an error injection pattern indicating one or more bits of data on which a pseudo-random error is to be inserted; and (2) generating an error injection trigger indicating when the pseudo-random error is to be inserted. Numerous other aspects are provided.

18 Claims, 3 Drawing Sheets

METHODS AND APPARATUS FOR ERROR INJECTION

FIELD OF THE INVENTION

The present invention relates generally to computer systems, and more particularly to methods and apparatus for error injection.

BACKGROUND

A computer system may include a chip adapted to receive data and/or transmit data via a link. The computer system may include logic (hereinafter "error detection and recovery logic") adapted to detect one or more errors in the received data and enable the system to recover from such errors. To test the error detection and recovery logic, one or more errors may intentionally be injected into the data. In a conventional computer system, such errors may be inserted in the data by physically breaking the link and applying the errors to the link. However, such a method of injecting errors in data may not be acceptable for a computer system employing a high-speed link. Accordingly, improved methods and apparatus for error injection are desired.

SUMMARY OF THE INVENTION

In a first aspect of the invention, a first method of injecting one or more errors in data flowing into or out of a chip is provided. The first method includes the steps of (1) generating an error injection pattern indicating one or more bits of data on which a pseudo-random error is to be inserted; and (2) generating an error injection trigger indicating when the pseudo-random error is to be inserted.

In a second aspect of the invention, a first apparatus for injecting one or more errors in data flowing into or out of a chip is provided. The first apparatus includes error injection logic having (1) at least one register; and (2) at least one multiplexer coupled to the at least one register. The apparatus is adapted to (a) generate an error injection pattern indicating one or more bits of data on which a pseudo-random error is to be inserted; and (b) generate an error injection trigger indicating when the pseudo-random error is to be inserted.

In a third aspect of the invention, a first system for injecting one or more errors in data is provided. The first system includes (1) a first chip; and (2) a second chip coupled to the first chip and adapted to at least one of receive data from and transmit data to the first chip. The second chip includes an apparatus for injecting one or more errors in data flowing into or out of the second chip having error injection logic including (a) at least one register; and (b) at least one multiplexer coupled to the at least one register. The apparatus is adapted to (i) generate an error injection pattern indicating one or more bits of data on which a pseudo-random error is to be inserted; and (ii) generate an error injection trigger indicating when the pseudo-random error is to be inserted. Numerous other aspects are provided, as are systems and apparatus in accordance with these and other aspects of the invention.

Other features and aspects of the present invention will become more fully apparent from the following detailed description, the appended claims and the accompanying drawings.

DETAILED DESCRIPTION

The present invention provides improved methods and apparatus for injecting one or more errors in data flowing into or out of a chip via a link. More specifically, the present invention may insert a pseudo-random error in data received by and/or transmitted from the chip via a link without breaking the link. The pseudo-random error may be based on an error injection pattern indicating one or more bits of the data on which the pseudo-random error is to be inserted and an error injection trigger indicating when such pseudo-random error is to be inserted in the data. The present invention may employ error injection logic to generate the error injection pattern and the error injection trigger. Such logic may be adapted to efficiently consume chip area. In this manner, the present invention provides improved methods and apparatus for injecting one or more errors in data flowing into or out of a chip.

Figure 1:
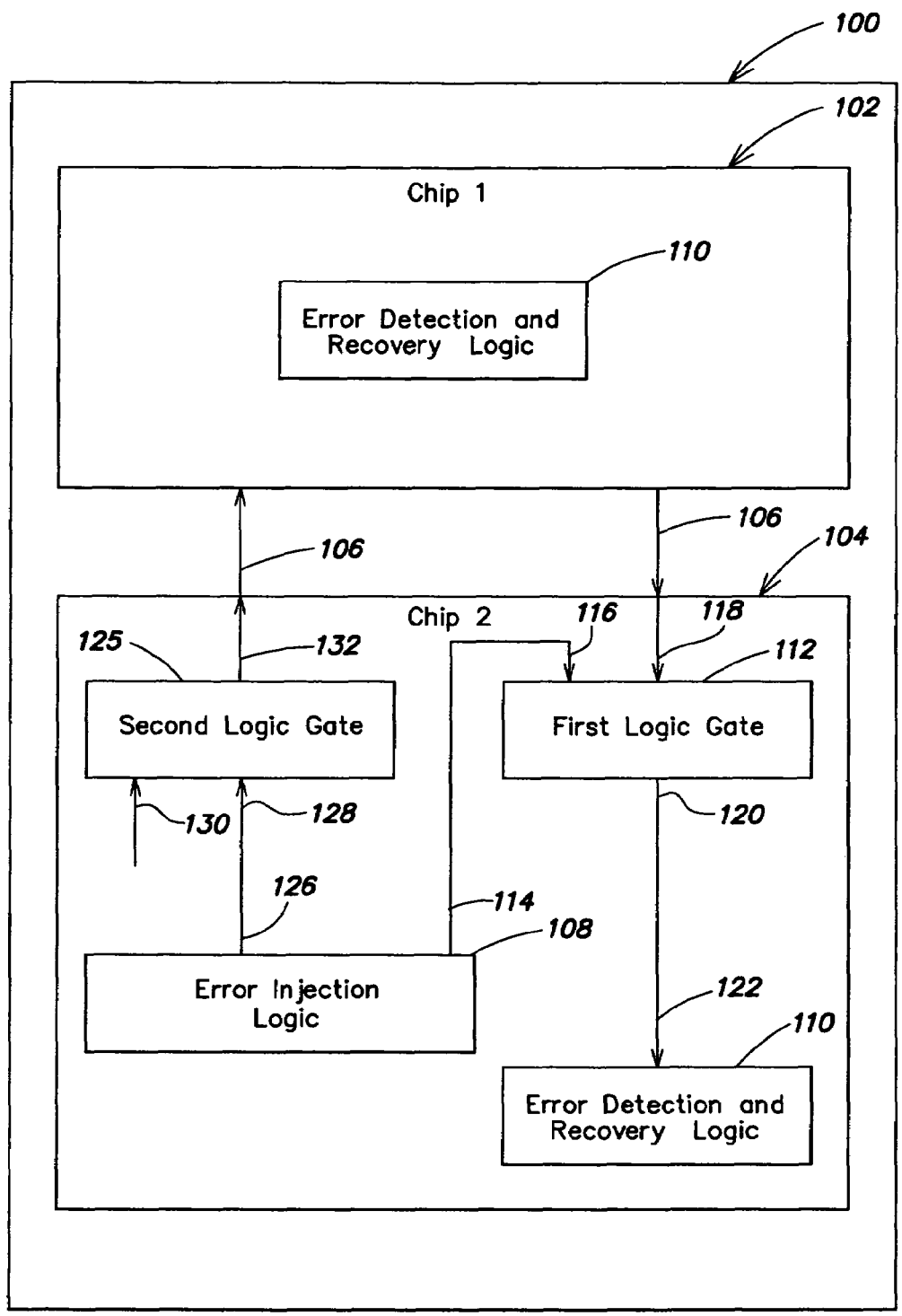
FIG. 1 illustrates a system adapted to inject one or more errors in data in accordance with an embodiment of the present invention.

FIG. 1 illustrates a system adapted to inject one or more errors in data in accordance with an embodiment of the present invention. With reference to FIG. 1, the system 100 may include a first chip 102 coupled to a second chip 104 via a link 106. In this manner, the first and second chips 102, 104 may each be adapted to receive data from and/or transmit data via the link 106. The link 106 may be a serial link adapted to transmit a serial stream of data (although a different configuration may be employed for the link 106). The link 106 may be a high-speed link, such as a 1 Gbps link (although a link 106 of a different speed may be employed).

The second chip 104 may include error injection logic 108 adapted to insert a pseudo-random error in data received by or transmitted from the chip 104. For example, the error injection logic 108 may be adapted to generate an error injection pattern indicating one or more bits of the data on which the pseudo-random error is to be inserted and an error injection trigger indicating when such pseudo-random error is to be inserted in the data. The pseudo-random error inserted in the data may be based on the error injection pattern and error injection trigger. Additional details of the structure and function of the error injection logic 108 are described below with reference to FIG. 2. The error injection logic 108 may be coupled to error detection and recovery logic 110 via a first logic gate 112 (e.g., an exclusive OR (XOR) gate). The error detection and recovery logic 110 may be adapted to detect one or more errors in the received data and enable the system 100 to recover from such errors. More specifically, a first output 114 of the error injection logic 108 may be coupled to a first input 116 of the first logic gate 112. The error injection pattern may be input by the first input 116 of the first logic gate 112. Data received by the second chip 104 via the link 106 (e.g., from the first chip 102) may be coupled to a second input 118 of the first logic gate 112. For example, the second chip 104 may be adapted to de-serialize a serial stream of data received from the link 106 into a chunk of parallel data (e.g., a 144-bit chunk of data). Such a chunk of parallel data may be input via the second input 118 of the first logic gate 112.

The first logic gate 112 is adapted to perform a Boolean algebra operation on data input by the first and second inputs 116, 118 thereof, thereby forming data with one or more errors inserted therein. The first logic gate 112 may be coupled to the error detection and recovery logic 110. More specifically, an output 120 of the first logic gate 112 may be coupled to an input 122 of the error detection and recovery logic 110. The data with one or more errors output from the logic gate 112 may be input by the error detection and recovery logic 110. The system 100 may employ the data with one or more errors to test the error detection and recovery logic 110. For example, if the error detection and recovery logic 110 detects and corrects the errors so that the system 100 may recover from such errors, the logic 110 is working properly. Alternatively, if the error detection and recovery logic 110 is unable to detect and/or correct the errors so that the system 100 may recover from such errors, the logic 110 may not be working properly.

In a similar manner, in some embodiments, the error injection logic 108 may be employed to insert one or more errors on data to be output from the second chip 104 via the link 106. For example, the error injection logic 108 may be coupled to a second logic gate 125 (e.g., an XOR gate). More specifically, a second output 126 of the error injection logic 108 may be coupled to an input 128 of the second logic gate 125. An error injection pattern may be input by the first input 128 of the second logic gate 125. Additionally, data to be transmitted from the second chip 104 may be coupled to a second input 130 of the second logic gate 125. Similar to the first logic gate 112, the second logic gate 125 is adapted to perform a Boolean algebra operation on data input by the first and second inputs 128, 130 of the second logic gate 125, thereby forming data with one or more errors inserted therein. The second logic gate 125 may be coupled to the link 106. More specifically, an output 132 of the second logic gate 125 may be coupled to the link 106. The data with one or more errors output from the second logic gate 125 may be output from the second chip 104 via the link 106. Injecting errors on data output from the second chip 104 may be useful in embodiments in which the first chip 102 includes error detection and recovery logic 110 but does not include error injection logic 108. In this manner, the data with errors output from the second chip 104 to the first chip 102 may be employed to test error detection and recovery logic 110 of the first chip 102.

Alternatively, in some embodiments, logic included in the first and second chips 102, 104 may be symmetrical. For example, similar to the second chip 104, the first chip 102 may include the error injection logic 108, error detection and recovery logic 110 and first and second logic gates 112, 125. Thus, the first chip 102 may inject errors into data after such data is received by the first chip 102 via the link 106.

Figure 2:
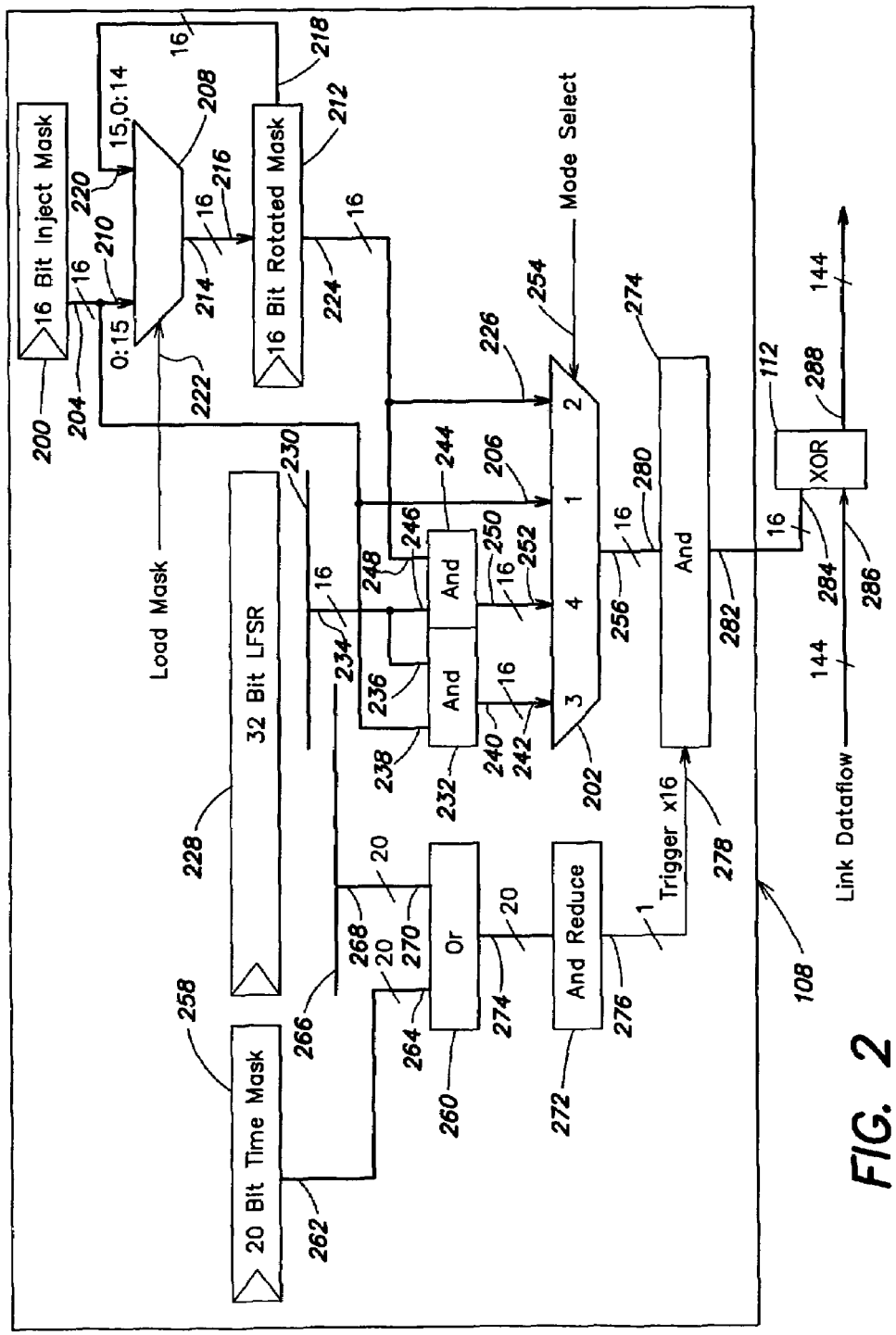
FIG. 2 illustrates error injection logic included in the system of FIG. 1 in accordance with an embodiment of the present invention.

FIG. 2 illustrates error injection logic 108 included in the system 100 of FIG. 1 in accordance with an embodiment of the present invention. With reference to FIG. 2, the error injection logic 108 may include sequential and/or combinational logic coupled together such that the error injection logic 108 efficiently consumes chip space and/or power. The error injection logic 108 may be adapted to output an error injection pattern with an average frequency over time. When output, the error injection pattern may be employed to insert a pseudo-random error into data received by and/or transmit from a chip (e.g., the second chip 108).

The error injection logic 108 may include a first register (e.g., shift register) 200 which is adapted to store a fixed error injection mask. In some embodiments, the fixed error injection mask may be 16 bits in size, and therefore, the first register 200 may be 16 bits wide. However, a larger or smaller fixed error injection mask may be employed, and consequently, a larger or smaller first register 200 may be employed. The fixed error injection mask may be employed to inject errors on a fixed number of data bits in fixed positions.

Test software may be employed to generate and/or load the fixed error injection mask into the first register 200. However, any other suitable method may be employed to load the fixed error injection mask into the first register 200. For example, the fixed error injection mask may be scanned into the first register (e.g., using control logic).

The first register 200 may be coupled to a first multiplexer 202 adapted to select an error injection mode (e.g., how the error is inserted in the data). More specifically, an output 204 of the first register 200 may be coupled to a first input 206 of the first multiplexer 202. Therefore, the fixed error injection mask may be input by the first multiplexer 202 via the first input 206. Additionally, the first register 200 may be coupled to a second multiplexer 208. More specifically, the output 204 of the first register 200 may be coupled to a first input 210 of the second multiplexer 208. Therefore, the fixed error injection mask may be input by the second multiplexer 208 via the first input 210 thereof. The second multiplexer 208 may be coupled to a second register 212 which is adapted to store a rotated error injection mask. For example, the second register 212 may shift (e.g., one bit position to the left or alternatively one bit position to the right) an error injection mask stored therein every time period (e.g., clock cycle). In some embodiments, the rotated error injection mask may be 16 bits in size, and therefore, the second register 212 may be 16 bits wide. However, a larger or smaller rotated error injection mask may be employed, and consequently, a larger or smaller second register 212 may be employed. The rotated error injection mask may be employed to inject errors on a fixed number of data bits in varying positions over time. More specifically, an output 214 of the second multiplexer 208 may be may be coupled to a first input 216 of the second register 212. Additionally, a first output 218 of the second register 212 may be coupled to a second input 220 of the second multiplexer 208. Therefore, the second multiplexer 208 may input via the second input 220 thereof an error injection mask stored by the second register 212.

The second multiplexer 208 may be adapted to selectively output data based on a control signal, Load Mask, input via a third input 222 thereof. For example, during a first time period (e.g., one or more machine or clock cycles), the fixed error injection mask may be stored by and output from the first register 200. Further, signal Load Mask may be asserted such that the fixed error injection mask may be output from the second multiplexer 208 and stored by the second register 212. During a subsequent time period, the second register (e.g., a mask rotating register) 212 may shift the fixed error injection mask (e.g., one bit position to left or alternatively one bit position to the right) such that the second register 212 stores a first rotated version of the fixed error injection mask (hereinafter "rotated error injection mask"). Such a rotated error injection mask may be output from the second register 212 and input by the second multiplexer 208 via the second input 220 thereof. In a subsequent time period, when Load Mask is deasserted, the second multiplexer 208 may output the first rotated error injection mask into the second register 212, which may shift the first rotated error injection mask to form a second rotated error injection mask. In a similar manner, the second multiplexer 208 and second register 212 may be employed to form additional rotated versions of the fixed error injection mask. In summary, the fixed error injection mask may be written in the first register 200 by software or by a suitable control mechanism. When the mask is written to the first register 200, the mask may also be copied into the second register 212. The second register 212 may perform a rotate operation on every time period. Alternatively, in some embodiments, the second register 212 may perform a rotate only after every injection trigger.

The second register 212 may be coupled to the first multiplexer 202. More specifically, a second output 224 of the second register 212 may be coupled to a second input 226 of the first multiplexer 202. Therefore, the rotated error injection mask may be input by the first multiplexer 202 via the second input 226. In this manner, the logic 108 may generate error injection masks to insert errors on a fixed number of bits.

Additionally, the error injection logic 108 may generate error injection masks to insert errors on a varying (e.g., random) number of bits. More specifically, the error injection logic 108 may include a linear feedback shift register (LFSR) 228 adapted to generate and store a pseudo-random number. In some embodiments, pseudo-random number may be 32 bits in size, and therefore, the LFSR 228 may be 32 bits wide. However, a larger or smaller pseudo-random number may be employed, and consequently, a larger or smaller LFSR 228 may be employed. The LFSR 228 may be coupled to a first bit vector 230 adapted to store and output a first portion (e.g., the 16 least significant bits (LSB)) of the pseudo-random number stored by the LFSR 228. The first portion may serve as a random data vector. The first bit vector 230 may be coupled to a first logic gate (e.g., AND gate) 232. More specifically, an output 234 of the first bit vector 230 may be coupled to a first input 236 of the first logic gate 232. Therefore, the first portion of the pseudo-random number (e.g., the random data vector) may be input by the first logic gate 232 via the first input 236. Additionally, the output 204 of the first register 200 may be coupled to a second input 238 of the first logic gate 232. Therefore, the fixed error injection mask may be input by the first logic gate 232 via the second input 238. The first logic gate 232 is adapted to perform a Boolean algebra operation (e.g. a logic AND operation) on data input by thereby. Data resulting from such an operation may serve as a randomized version of the fixed error injection mask (hereinafter "randomized fixed error injection mask"). The randomized fixed error injection mask may insert a pseudo-random error on a reduced number of data bits compared to the number of data bits on which errors are inserted using the fixed error injection mask.

The first logic gate 232 may be coupled to the first multiplexer 202. More specifically, an output 240 of the first logic gate 232 may be coupled to a third input 242 of the first multiplexer 202. Therefore, the randomized fixed error injection mask may be input by the first multiplexer 202 via the third input 242 thereof.

Additionally, the first bit vector 230 may be coupled to a second logic gate (e.g., AND gate) 244. More specifically, the output 234 of the first bit vector 230 may be coupled to a first input 246 of the second logic gate 244. Therefore, the first portion of the pseudo-random number may be input by the second logic gate 244 via the first input 246 thereof. Additionally, the output 224 of the second register 212 may be coupled to a second input 248 of the second logic gate 244. Therefore, the rotated error injection mask may be input by the second logic gate 244 via the second input 248 thereof. The second logic gate 244 is adapted to perform a Boolean algebra operation (e.g. a logic AND operation) on data input by thereby. Data resulting from such an operation may serve as a randomized version of the rotated error injection mask (hereinafter "randomized rotated error injection mask"). The randomized rotated error injection mask may insert a pseudo-random error on a reduced number of data bits compared to the number of data bits on which errors are inserted using the rotated error injection mask.

The second logic gate 244 may be coupled to the first multiplexer 202. More specifically, an output 250 of the second logic gate 244 may be coupled to a fourth input 252 of the first multiplexer 202. Therefore, the randomized rotated error injection mask may be input by the first multiplexer 202 via the fourth input 252 thereof. Although the first and second logic gates 232, 244 are coupled to the same portion of the pseudo-random number stored in the LFSR 228, in some embodiments, the first and second logic gates 232, 244 may be coupled to different portions of the pseudo-random number.

The first multiplexer 202 may be adapted to selectively output data via an output 256 based on a control signal, Mode Select, input via a fifth input 254 of the first multiplexer 202. Therefore, by outputting the fixed error injection mask, rotated error injection mask, randomized fixed error injection mask or randomized rotated error injection mask from the first multiplexer 202, the error injection logic 108 may select an error injection mode. The mask output by the first multiplexer 202 may serve as an error injection pattern indicating one or more bits of data on which a pseudo-random error is to be inserted. In this manner, the error injection logic 108 may provide four modes of error bit selection. In a first operational mode, the fixed error injection mask may be employed to inject errors on one or more particular data bits every time the trigger fires. In a second operational mode, a rotating mask (e.g., the rotated error injection mask) may be employed to inject errors a constant number of bits per injection but on bit positions that vary over time. The rotated error injection mask may be a rotated version of the fixed error injection mask employed during the first operational mode. In a third operational mode, the randomized fixed error injection mask may be employed to inject errors, in response to each trigger, on a randomized number of bits that would have been selected by the fixed error injection mask. In a fourth operational mode, the randomized rotated error injection mask may be employed to inject errors, in response to each trigger, on a randomized number of bits selected by the rotated error injection mask. However, the error injection logic 108 may provide a larger or smaller number of and/or different modes.

In addition to selecting one of a plurality of modes that indicate which bits of data will be injected with an error, the error injection logic 108 may be adapted to indicate when such mode may be employed to inject an error in the data. In this manner, a pseudo-random error may be inserted on one or more data bits. More specifically, the error injection logic 108 may include a fifth register 258 which is adapted to store a time mask. In some embodiments, the time mask may be 20 bits in size, and therefore, the fifth register 258 may be 20 bits wide. However, a larger or smaller time mask may be employed, and consequently, a larger or smaller fifth register 258 may be employed. A frequency with which a pseudo-random error is inserted in data may be based (in part) on the time mask. Test software may be employed to generate and/or load the time mask into the fifth register 258. However, any other suitable method may be employed to load the time mask into the fifth register 258. For example, the time mask may be scanned into the fifth register 258 (e.g., via control logic).

The fifth register 258 may be coupled to a third logic gate (e.g., an OR gate) 260. More specifically, an output 262 of the fifth register 258 may be coupled to a first input 264 of the third logic gate 260. Therefore, the time mask may be input by the third logic gate 260 via the first input 264 thereof.

Additionally, the LFSR 228 may be coupled to a second bit vector 266 adapted to store and output a second portion (e.g., the 20 most significant bits (MSB)) of the pseudo-random number stored by the LFSR 228. The second portion may serve as a random time vector. The second bit vector 266 may be coupled to the third logic gate 260. More specifically, an output 268 of the second bit vector 266 may be coupled to a second input 270 of the third logic gate 260. Therefore, the second portion of the pseudo-random number (e.g., random time vector) may be input by the third logic gate 260 via the second input 270 thereof. The fourth logic gate 260 is adapted to perform a Boolean algebra operation (e.g., a logic OR operation) on data input by thereby. Data resulting from such an operation may serve as a masked version of the second portion of the pseudo-random number (hereinafter "masked pseudo-random number"). More specifically, the time mask may force a predetermined number (e.g., zero to all) of bits of the second portion of the pseudo-random number to a state (e.g., a logic "1"). A remaining number of bits of the second portion of the pseudo-random number may determine a frequency with which a pseudo-random error is inserted in the data. For example, a pseudo-random error may be inserted in data when all of the remaining number of bits are of a high logic state (e.g., a logic "1"). Therefore, if the time mask masks off all but n bits of the second portion of the pseudo-random number, a pseudo-random error may be inserted in data on average once every $2^n$ time periods. Thus the error injection logic 108 may provide a capability of injecting errors at a random interval which averages to a constant over time. The average interval may be based on the time mask. By ORing the time mask with the random time vector, only a subset of the random time vector bits may determine or affect error injection frequency, thereby allowing for faster injection rates. If the time mask masks off all bits of the random time vector, no bits of the random time vector determine or affect the error injection rate, and therefore, the error injection logic 108 injects a hard error in the data (e.g., one or more of the same bit positions of data are injected with an error every cycle).

Generally, as described above, error injection may be based on the random time vector. As a further example, when all bit of the random time vector are of a high logic state (e.g., logic "1"s), a pseudo-random error may be injected in data during such a time period. If all bits of the random time vector remain of the high logic state for a plurality of sequential time periods, a burst of pseudo-random errors may be generated. In some embodiments, the error injection logic 108 may be modified such that a burst of errors may be converted to a single shot of pseudo-random error in a data packet. Such a modification is known to one of skill in the art. More specifically, such a data packet may require a plurality of consecutive cycles to be transmitted on the link 106. The error injection logic 108 may be adapted to inject a pseudo-random error in data of the data packet during one of the plurality of consecutive cycles.

The third logic gate 260 may be coupled to fourth logic 272. The fourth logic 272 (e.g., one or more logic gates) may be adapted to perform Boolean algebra operations on a plurality of input bits and output a bit based thereon. For example, if all bits input by the fourth logic 272 are of a high logic state, the result of the Boolean algebra operations may be a bit of high logic state. Otherwise, the result of the Boolean algebra operations may be a bit of a low logic state (e.g., a logic "0"). The fourth logic 272 may include a plurality of AND gates adapted to perform the above-described function, and therefore, may hereinafter be referred to as and reduce logic 272. The result, Trigger, of such Boolean operations may serve to trigger injection of a pseudo-random error in data.

The and reduce logic 272 may be coupled to a fifth logic gate 274 (e.g., AND gate). More specifically, an output 276 of the and reduce logic 272 may be coupled to a first input 278 of the fifth logic gate 274. For example, the result of the Boolean operation output from the and reduce logic 272 may be replicated a plurality of times (e.g., sixteen times) and such replicated result may be input by the fifth logic 274 via the first input 278 thereof. Such replicated value may serve as an error injection trigger. Additionally, the output 256 of the first multiplexer 202 may be coupled to a second input 280 of the fifth logic 274. Therefore, the fixed error injection mask, rotated error injection mask, randomized fixed error injection mask or randomized rotated error injection mask may be input by the fifth logic 274. The fifth logic gate 274 may be adapted to perform a Boolean algebra operation on data input by the first and second inputs 278, 280 thereof. When the trigger is a high logic state, the result of the Boolean algebra operation may be the mask input by the fifth logic 274 via the second input 280 thereof. Alternatively, when the trigger is of a low logic state, the result of the Boolean algebra operation may be data of a low logic state (e.g., sixteen bits of logic "0"s). The result may serve as error injection bit pattern and may be output from the fifth logic 274 via an output 282. The output 282 of the fifth logic 274 may serve as the output of the error detection logic 108.

The error detection logic 108 described above may efficiently consume chip space. The error detection logic 108 described above is exemplary, and therefore, a larger or smaller amount of logic may be employed. Additionally or alternatively, a different configuration may be employed for the error detection logic 108.

As stated, the error injection logic 108 may be coupled to the logic gate (e.g., XOR gate) 112 of the system 100. More specifically, the output 282 of the sixth logic gate 274 may be coupled to a first input 284 of the logic gate 112 of the system 100. Therefore, an error injection pattern may be input by the logic gate 112 via the first input 284 thereof. Additionally, a flow of data (e.g., received by the second chip 104 via the link 106 or to be transmitted from the second chip 104 on the link 106) may be combined into chunks of data (e.g., a 144 bit chunk of data) and such data may be input by the first logic gate 112 via a second input 286 thereof. The logic gate 112 may be adapted to perform a Boolean algebra operation (e.g., a logic XOR operation) on the error injection pattern and select portions of the data input via the second input 286 and output a result of such operation via an output 288. The result may serve as data (e.g., 144 bits of data) with a pseudo-random error injected therein. Such data with a pseudo-random error injected therein may be employed to test the error detection and recovery logic 110.

Thus, present apparatus for injecting errors may be positioned in the chip internal dataflow path and provide a capability to toggle any bit in the dataflow at a randomized trigger time, thereby inserting an error in data. Such a capability may be based on an injection mask which may be provided by software or scanned in by control logic on every machine cycle that is used to toggle one or more bits within the link dataflow. For example, when the present methods and apparatus are employed to insert pseudo-random errors on data transmitted on a high-speed serial communications link such as an input/output interface (IOIF) employed in the Cell Broadband Engine (BE) processor, manufactured by the assignee of the present invention, IBM Corporation of Armonk, N.Y., sixteen bits of the main link may be injected with errors. Of the sixteen, twelve bits may contain all link header and control signal information for the interface protocol (e.g., broadband engine interface (BIF)/IOIF) that is carried across the link. Errors may be injected across the entire header/control fields of the interface.

Through use of the present methods and apparatus, minimal hardware may be employed to insert a pseudo-random error in data received by a chip 102, 104 from a link 106 or to be transmitted from the chip 102, 104 via the link 106 (e.g., without breaking the link 106). The pseudo-random error may be based on an error injection pattern and an error injection trigger generated by the present methods and apparatus. The error injection pattern may indicate a number and position of data bits on which an error is to be inserted and the error injection trigger may indicate when (e.g., a frequency with which) the error injection pattern should be employed to inject the pseudo-random error in the data. Therefore, the present methods and apparatus may provide a wide variety of error injection. For example, the present methods and apparatus may be employed to inject a single shot of pseudo-random error. More specifically, a data packet may be transmitted (e.g., through the logic gate 112) over a plurality of clock cycles, and the present methods and apparatus may be employed to insert a single pseudo-random error in the data packet during one of such cycles. Additionally, the present methods and apparatus may be employed to inject a burst of pseudo-random errors in a flow of data (e.g., inject a pseudo random error in data during consecutive clock cycles). Further, the present methods and apparatus may be employed to inject a hard error in a data flow (e.g., a stuck at fault in which the same bit positions of data remain at a fixed value). Additionally, the error injection logic 108 may employ the time mask and random time vector to produce variable randomized injection rates at which pseudo-random errors may be inserted in data. Further, the error injection logic 108 may generate an error injection pattern that may be employed to provide a fixed or random error bit selection when applied to data.

Thus, the present methods and apparatus may be employed to insert pseudo-random errors on data transmitted on a high-speed serial communications link such as an input/output interface (IOIF) employed in the Cell BE processor. The link may be serial or serial-parallel (e.g., a link on which data is transmitted serially, and thereafter, deserialized). Such errors may be employed to verify correct operation by the recovery protocols which are implemented (e.g., by error detection and recovery logic 110) as part of the interface. By implementing a small amount of hardware to inject such errors, the present methods and apparatus may efficiently consume chip area and power while providing a fairly robust error injection mechanism.

Figure 3:
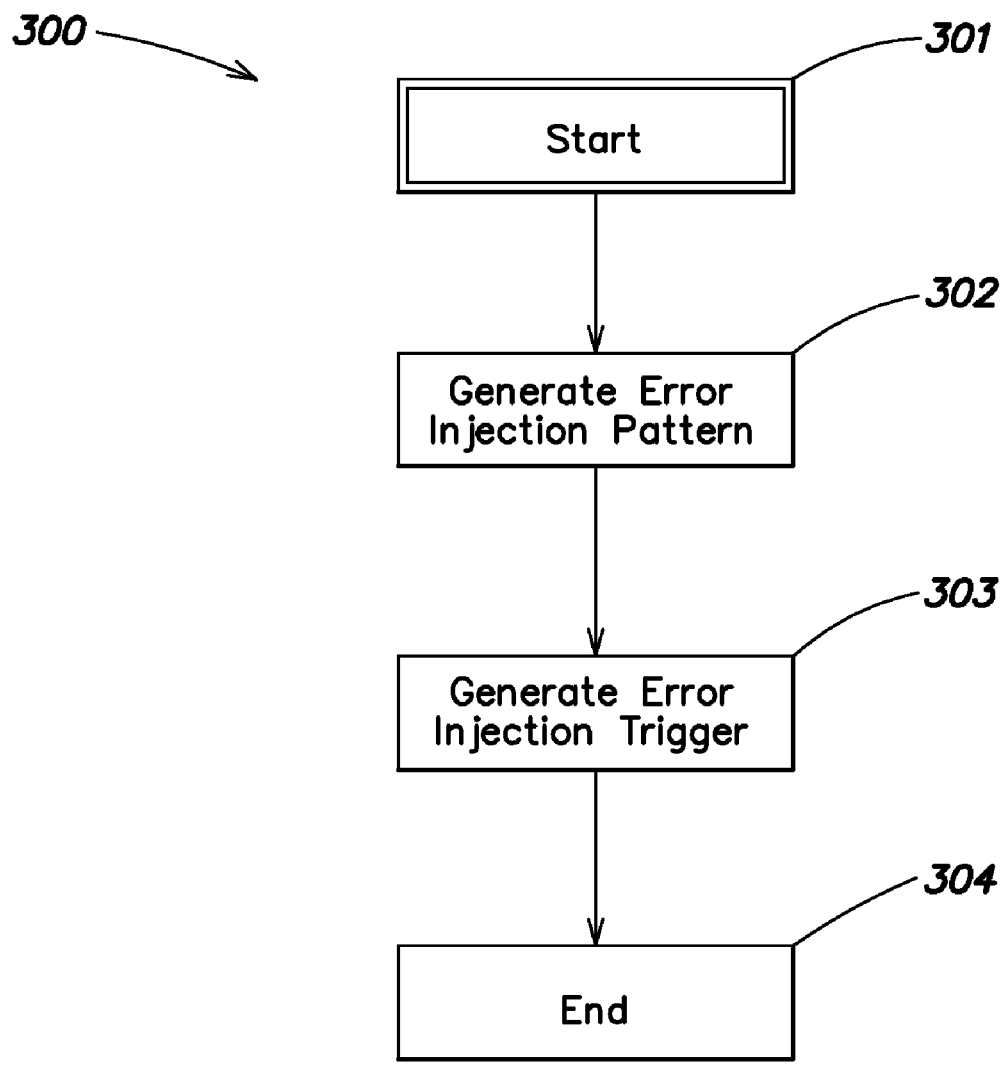
FIG. 3 illustrates a method adapted to inject one or more errors in data in accordance with an embodiment of the present invention.

FIG. 3 illustrates a method adapted to inject one or more errors in data in accordance with an embodiment of the present invention. With reference to FIG. 3, the method to inject errors 300 may start at step 301. Next, at step 302 an error injection pattern may be generated. The pattern may indicate one or more bits of the data on which an error is to be inserted. In step 303 an error injection trigger may be generated. The trigger may indicate when such an error is to be inserted in the data. The error injection method may end at step 304. By following method 300, an error inserted in the data may be based on the error injection pattern and error injection trigger.

The foregoing description discloses only exemplary embodiments of the invention. Modifications of the above disclosed apparatus and methods which fall within the scope of the invention will be readily apparent to those of ordinary skill in the art. For instance, although the second register 212 rotates the mask every machine cycle, in some embodiments, such a mask may be rotated after an error injection (e.g., after each trigger). Further, sizes of masks, vectors and results of Boolean algebra operations described above are exemplary, and therefore, a larger or smaller size may be employed for any of the masks, vectors and/or results. For example, the bit width of one or more fields described above may be tailored to a particular application and desired error injection capability. Although a time mask of a first size (e.g., 20 bits) is described above, a smaller time mask may be employed to serve the same purpose. For example, ten bits may be employed as the time mask. Each bit of such time mask may be applied to two bits of the random time vector (e.g., during a logic OR operation).

Accordingly, while the present invention has been disclosed in connection with exemplary embodiments thereof, it should be understood that other embodiments may fall within the spirit and scope of the invention, as defined by the following claims.

The invention claimed is:

1. A method of injecting one or more errors in data flowing into or out of a chip for the purpose of testing logic without breaking a link to or from the chip, comprising:
   generating an error injection pattern indicating one or more bits of data on which a pseudo-random error is to be inserted; and
   generating an error injection trigger indicating when the pseudo-random error is to be inserted,
   wherein generating the error injection trigger includes generating the error injection trigger based on a pseudo-random number and a time mask, wherein the time mask indicates a frequency with which the pseudo-random error is inserted in the data.

2. The method of claim 1 further comprising inserting the pseudorandom error in the data based on the error injection pattern and the error injection trigger.

3. The method of claim 2 wherein inserting the pseudo-random error in the data includes inserting the pseudo-random error in the data on consecutive cycles or non-consecutive cycles.

4. The method of claim 1 wherein generating the error injection pattern includes generating the error injection pattern based on a fixed error injection mask, a rotated version of the fixed error injection mask, a randomized version of the fixed error injection mask or a randomized version of the rotated version of the fixed error injection mask.

5. The method of claim 1 further comprising reducing an amount of chip space required to insert the pseudo-random error in the data.

6. An apparatus for injecting one or more errors in data flowing into or out of a chip, comprising:
   error injection logic including:
     at least one register; and
     at least one multiplexer coupled to the at least one register;
     wherein the register is adapted to store a mask or a pseudo random number;
     wherein the multiplexer is adapted to select an error injection mode;
   wherein the apparatus is adapted to:
     generate an error injection pattern indicating one or more bits of data on which a pseudo-random error is to be inserted; and
     generate an error injection trigger indicating when the pseudorandom error is to be inserted.

7. The apparatus of claim 6 further comprising a logic gate coupled to the error injection logic;
   wherein the apparatus is further adapted to employ the logic gate to insert the pseudo-random error in the data based on the error injection pattern and the error injection trigger.

8. The apparatus of claim 7 wherein the apparatus is further adapted to employ the logic gate to insert the pseudo-random error in the data on consecutive cycles or non-consecutive cycles.

9. The apparatus of claim 6 wherein the apparatus is further adapted to generate the error injection pattern based on a pseudo-random number.

10. The apparatus of claim 6 wherein the apparatus is further adapted to generate the error injection trigger based on a pseudo-random number and a time mask, wherein the time mask indicates a frequency with which the pseudo-random error is inserted in the data.

11. The apparatus of claim 6 wherein the apparatus is further adapted to generate the error injection pattern based on a fixed error injection mask, a rotated version of the fixed error injection mask, a randomized version of the fixed error injection mask or a randomized version of the rotated version of the fixed error injection mask.

12. The apparatus of claim 6 wherein the apparatus is further adapted to reduce an amount of chip space required to insert the pseudo-random error in the data.

13. A system for injecting one or more errors in data, comprising:
a first chip; and
a second chip coupled to the first chip and adapted to receive data from and/or transmit data to the first chip;
wherein the second chip includes an apparatus for injecting one or more errors in data flowing into or out of the second chip having:
error injection logic including:
at least one register; and
at least one multiplexer coupled to the at least one register;
wherein the register is adapted to store a mask or a pseudo random number;
wherein the multiplexer is adapted to select an error injection mode;
wherein the apparatus is adapted to:
generate an error injection pattern indicating one or more bits of data on which a pseudo-random error is to be inserted; and
generate an error injection trigger indicating when the pseudo-random error is to be inserted.

14. The system of claim 13 wherein:
the apparatus further comprises a logic gate coupled to the error injection logic; and
the apparatus is further adapted to employ the logic gate to insert the pseudo-random error in the data based on the error injection pattern and the error injection trigger.

15. The system of claim 14 wherein the apparatus is further adapted to insert the pseudo-random error in the data on consecutive cycles or non-consecutive cycles.

16. The system of claim 13 wherein the apparatus is further adapted to generate the error injection pattern based on a pseudo-random number.

17. The system of claim 13 wherein the apparatus is further adapted to generate the error injection trigger based on a pseudo-random number and a time mask, wherein the time mask indicates a frequency with which the pseudo-random error is inserted in the data.

18. The system of claim 13 wherein the apparatus is further adapted to generate the error injection pattern based on a fixed error injection mask, a rotated version of the fixed error injection mask, a randomized version of the fixed error injection mask or a randomized version of the rotated version of the fixed error injection mask.

* * * * *